United States Patent
Fonden et al.

(10) Patent No.: US 8,442,460 B2
(45) Date of Patent: May 14, 2013

(54) METHOD FOR COMPENSATING SIGNAL DISTORTIONS IN COMPOSITE AMPLIFIERS

(75) Inventors: Tony Fonden, Kista (SE); Richard Hellberg, Huddinge (SE); Mats Klingberg, Enskede (SE); Spendim Dalipi, Sollentuna (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 670 days.

(21) Appl. No.: 12/296,710

(22) PCT Filed: Apr. 10, 2006

(86) PCT No.: PCT/SE2006/050067
§ 371 (c)(1),
(2), (4) Date: Oct. 10, 2008

(87) PCT Pub. No.: WO2007/117189
PCT Pub. Date: Oct. 18, 2007

(65) Prior Publication Data
US 2009/0163154 A1    Jun. 25, 2009

(51) Int. Cl.
*H04B 1/04* (2006.01)

(52) U.S. Cl.
USPC .......................... 455/114.2; 455/91; 455/120

(58) Field of Classification Search ................ 455/114.2
See application file for complete search history.

(56) References Cited

U.S. PATENT DOCUMENTS

| | | | | |
|---|---|---|---|---|
| 5,302,914 | A * | 4/1994 | Arntz et al. | 330/129 |
| 5,886,575 | A * | 3/1999 | Long | 330/129 |
| 5,901,346 | A * | 5/1999 | Stengel et al. | 455/126 |
| 5,974,041 | A * | 10/1999 | Kornfeld et al. | 370/342 |
| 5,990,734 | A * | 11/1999 | Wright et al. | 330/2 |
| 6,054,894 | A * | 4/2000 | Wright et al. | 330/149 |
| 6,054,896 | A * | 4/2000 | Wright et al. | 330/149 |
| 6,201,452 | B1 * | 3/2001 | Dent et al. | 332/103 |
| 6,587,511 | B2 * | 7/2003 | Barak et al. | 375/295 |
| 7,071,774 | B2 * | 7/2006 | Hellberg | 330/124 R |
| 7,738,619 | B2 * | 6/2010 | Hasson et al. | 375/376 |

FOREIGN PATENT DOCUMENTS

| | | |
|---|---|---|
| EP | 1492228 A1 | 12/2004 |
| JP | 200022659 A | 1/2000 |
| JP | 2005117599 A | 4/2005 |
| WO | 9966637 A1 | 12/1999 |
| WO | 0191288 A1 | 11/2001 |
| WO | 02095933 A1 | 11/2002 |

OTHER PUBLICATIONS

Supplementary European Search Report issued in Application No. EP 06717146 on Sep. 14, 2009, 3 pages.
Office Action issued on Feb. 25, 2011 in corresponding Japanese Application No. 2009-505322 with English language summary, 5 pages.
Office Action issued on Jul. 14, 2010 in corresponding Chinese Patent Application No. 200680054195.1 (English translation), 16 pages.
Office Action issued on Oct. 5, 2009 in European Patent Application No. 06717146.2, 3 pages.

\* cited by examiner

*Primary Examiner* — Ryan Jager
(74) *Attorney, Agent, or Firm* — Rothwell, Figg, Ernst & Manbeck, P.C.

(57) ABSTRACT

A method for compensating signal distortions in multiple transmitting branches (3, 5; 43, 45, 46) entering a composite amplifier (1; 1'). According to the invention the method comprises the steps of: —providing (S1) one or more input signals (x) to the composite amplifier. —observing (S2) an output signal (z) from the composite amplifier (1; 1') for each provided input signal; —deriving (S5) an error in each output signal (z) by comparing the output signal with an ideal output signal, said error being caused by said signal distortions; —deriving (S11) the individual contribution from each transmitting branch (3, 5; 43,45,46) to the error by utilizing a composite amplifier model, said composite amplifier model comprising information about the contribution from each constituent amplifier (23, 25; 103a,103b,103c) to the output signal for each provided input signal: —compensating the signal distortions in the transmitting branches (3, 5; 43,45,46) accordingly.

31 Claims, 4 Drawing Sheets

METHOD FOR COMPENSATING SIGNAL DISTORTIONS IN COMPOSITE AMPLIFIERS

CROSS-REFERENCE TO RELATED APPLICATIONS

This application is a 35 U.S.C. §371 National Phase Application from PCT/SE2006/050067, filed Apr. 10, 2006, and designating the United States.

TECHNICAL FIELD OF THE INVENTION

The present invention relates to a method and a system for compensating signal distortions in multiple transmitting branches of a composite amplifier.

BACKGROUND OF THE INVENTION

Composite amplifiers are amplifiers that contain several, individually driven, constituent amplifiers connected to each other and the output via special output networks. (Constituent amplifier means a single transistor, or a parallel combination of transistors, together with supporting circuitry.) This gives composite amplifiers better efficiency than single-transistor amplifiers (or amplifiers with several transistors driven collectively). Doherty and Chireix amplifiers are widely known examples of composite amplifiers. They are described in W. H. Doherty, "A new high efficiency power amplifier for modulated waves," *Proc. IRE*, vol. 24, no. 9, pp. 1163-1182. September 1936 and in H. Chireix, "High power outphasing modulation", *Proc. IRE*, vol. 23. no. 2. pp. 1370-1392. November 1935. The Doherty amplifier can be generalized to more than two constituent amplifiers, as described in e.g. F. H. Raab. "Efficiency of Doherty RF Power Amplifier Systems". IEEE Transactions on Broadcasting, vol. BC-33, no. 3. September 1987.

Several new high-order (3 or more constituent amplifiers) composite amplifiers with better efficiency have been disclosed recently in for example WO 2004/023647, WO 2004/057755, WO 2005/031966 and U.S. Pat. No. 5,012,200.

A Doherty amplifier consists of a main amplifier and an auxiliary (peak) amplifier connected to each other and the output via an output network. A prototypical output network that gives Doherty operation consists of a main amplifier connected to a common load via a quarter-wavelength line having characteristic impedance equal to the main amplifier's optimal load resistance. The auxiliary amplifier is connected directly to the common load. The common load resistance is equal to the parallel connection of the optimal loads of the main and auxiliary amplifiers.

Doherty Radio Frequency (RF) Power Amplifiers (PAs) are very efficient for amplitude-modulated signals, since they have lower average sum of RF output currents from the transistors than conventional amplifiers. Reduced RF current translates into reduced DC (supply) current since class B (half-wave rectified sine transistor current waveform) or similar operation Of the constituent transistors is used.

An important property of the Doherty output network is that it allows the auxiliary amplifier to influence the RF voltage at the main amplifier while affecting its own RF voltage, and the output voltage, much less (ideally zero). This means that the auxiliary amplifier's input drive can be off at output levels below a transition point without consequence to the output. The quarter wavelength line transforms the load into higher impedance at the main amplifier. This has two consequences: 1) the main amplifier's efficiency increases, 2) the main amplifier reaches saturation at a level well below its maximum output power (i.e. the transition point). At levels above the transition point, the auxiliary amplifier keeps the main amplifier voltage at a substantially constant level. This means that the nonlinearity due to the main amplifier's saturation can be kept low.

The main amplifies gives a substantially linear output RF current over the whole amplitude range, while the auxiliary amplifier gives a linearly rising RF current only above the transition point, i.e. a nonlinear output current. These two currents also have a phase difference of 90 degrees. By providing RF current, the auxiliary amplifier also contributes to the output power in the upper amplitude range.

A Chireix amplifier has a different output network than a Doherty amplifier, and is traditionally driven with equal amplitudes for both amplifiers. The term "outphasing", which describes the key method in Chireix amplifiers, generally means the method of obtaining amplitude modulation by combining two phase-modulated constant-amplitude signals. The phases of these constant-amplitude signals are chosen so that the result from their vector-summation yields the desired amplitude.

Compensating reactances in the output network of the Chireix amplifier are used to extend the region of high efficiency to lower output power levels. An equivalent network can be built with shortened and lengthened transmission lines, whose sum should be 0.5 wavelengths.

High-order composite amplifiers (see for example WO 2004/023647, WO 2004/057755, WO 20051031966) generally use combinations of Doherty-like drive signals (one or more amplifiers are driven only above some amplitude) and Chireix-like drive signals (two of the constituent amplifiers ale driven with equal amplitudes in some amplitude range).

Direct IQ-modulation in transmitter is the direct modulation of a complex baseband signal to a real, analog, signal at intermediate frequency (IF) or final RF. The real and imaginary parts of a complex baseband signal are commonly called (due to their mapping to the RF signal) In-phase (I) or Quadrature-phase (Q), hence the name IQ-modulation. Direct IQ-modulation has several advantages, chief of which are the high utilization of the available bandwidth of the Digital-to-Analog Converters (DACs), and that this bandwidth is split between two DACs. Both advantages lower the cost of the DAC system.

Direct IQ-modulators are analog complex-to-real multipliers, i.e. two four-quadrant analog multipliers coupled to a summing node. The multiplicands are two 90-degree offset Local Oscillator (LO) signals at the target frequency. The IQ-modulation process is prone to errors due to various imbalances and offsets in the LO signals. DC levels, analog circuitry and DAC outputs. These errors can vary nonlinearly with amplitude and also be frequency-dependent. For conventional amplifiers they are observable in the output signal. They are also correctable. This is discussed in the article "Digital Precompensation of Imperfections in Quadrature Modulators", R. Marchesani. IEEE. Trans. on Communications. vol. 48. no. 4, April 2000, pp. 552-556.

Composite amplifiers are however preferred in many products for efficiency reasons as described above. The composite amplifiers consists of two or more coupled, individually driven, amplifiers. With one IQ-modulator for each amplifier the different errors from the IQ-modulators are mixed and can not easily be individually observed in the transmitter output. Therefore, with a single observation receiver there will be a residual error due to not being able to individually observe the individual IQ-modulators errors.

A straightforward solution would be to instead observe the individual constituent amplifier inputs. This, however, means that two (in the case of Doherty or Chireix) or more observation receivers or a receiver with several switchable inputs must be used, which increases cost. In many situations, the transmitter output too must be observed anyway, for purposes of linearization, which then increases the number of observation receivers to at least three.

SUMMARY

An object of the invention is to provide an easy and effective method and system for compensation of signal distortions in multiple transmitting branches entering a composite amplifier.

This is achieved in a method according to claim 1, in a system according to claim 9 and in a compensation adjustment means according to claim 17.

Hereby the signal distortions in each transmitting branch entering a composite amplifier can be derived by observing only the output signal from the composite amplifier. No extra observation receivers need to be provided and hereby an easy method using a less complex observation receiver is achieved.

Preferably a transmitting branch model comprising information about the parameters that affect signal distortions for each transmitting branch is used to derive the contribution from different parameters in the transmitting branches to the signal distortion that causes the observed error; and compensating parameters or adjustments to already existing compensating parameters are provided to each transmitting branch accordingly in order to decrease the signal distortions. Hereby each parameter in the transmitting branch that contributes to the signal distortion can be individually compensated for.

Advantageously derivatives are derived of the output signal in respect of the different compensating parameters by utilising said composite amplifier model and said transmitting branch models and said derivatives are utilised for adapting said compensating parameters such that the error in the output signal is minimised. Hereby a flexible way of compensating signal distortions in many different types of composite amplifiers is achieved.

Suitably at least two different input signals levels or frequencies are provided such that the different transmission branches contribute in different amounts to the output signal for the different input signals. Hereby individual constituent amplifiers of the composite amplifier can be singled out or different sets of constituent amplifiers can be activated in different amounts in order to simplify the computation of the contribution from each transmitting branch to the total error. By providing different input signals it is also possible to iterate the method steps in order to obtain gradually improved compensations of the signal distortions.

DETAILED DESCRIPTION OF EMBODIMENTS

Figure 1A:
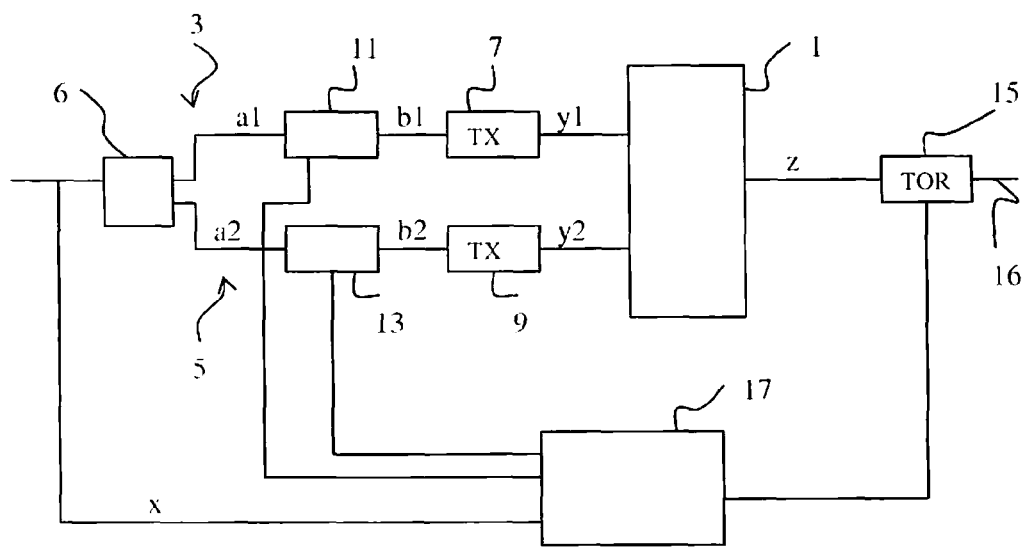
FIG. 1a shows schematically a system according to one embodiment of the invention.

In FIG. 1a a system for compensation of signal distortions according to one embodiment of the invention is schematically illustrated. This system can for example be positioned in a base station for mobile systems.

The system comprises a composite amplifier 1 into which in this embodiment a first and a second transmitting branch 3, 5 are input. Signals y1 and y2 are the signal inputs to the composite amplifier 1 from the first and second transmitting branches 3, 5 respectively. In this example a composite amplifier having two inputs is described but composite amplifiers having three, four or even more inputs could also be used in this invention. The composite amplifier 1 could be any kind of composite amplifier and it can have different numbers of constituent amplifiers. Doherty and Chireix amplifiers are two commonly known examples of composite amplifiers with two constituent amplifiers and two inputs.

The system comprises a generating means 6 for generating two input signals a1, a2 to the transmitting branches 3, 5. An input signal x to the generating means 6 is further also fed to a compensation adjustment means 17 further described below. The first transmitting branch 3 comprises a first TX box 7 directly connected to the first input of the composite amplifier 1. The first TX box 7 comprises for example a Digital to analog converter. DAC and an IQ-modulator. It could also comprise amplifiers and filters. The DAC and the IQ-modulator provides some signal distortion to the signal passing the first TX box 7. Below we will denote the different factors providing signal distortions as parameters and the parameters could thus for example be IQ errors, time delay, frequency errors or non linearities. Corresponding second TX box 9 is positioned in the second transmitting branch 5 and connected to the second input of the composite amplifier 1.

According to the invention the first transmitting branch 3 comprises further a first compensation means 11 connected to the first TX box 7 and the second transmitting branch 5 comprises a second compensation means 13 connected to the second TX box 9. These compensation means 11, 13 provide according to the invention a distortion to the passing signal that substantially compensates for the signal distortions caused later in the first TX box 7 and second TX box 9 respectively.

The system comprises also a transmitter observation receiver, TOR 15 connected to an output from the composite amplifier 1. The output signal from the composite amplifier is called z. An output 16 from the TOR that can be connected to for example an antenna is also indicated in the Figure. According to the invention the system comprises further a compensation adjustment means 17 connected to the TOR 15, the two compensation means 11, 13 and as said above to the input of the generating means 6.

The signal z detected in the TOR 15 will have an error in relation to the input signal x depending on the signal distortions provided in the first and second TX boxes 7, 9 assuming the signal distortions provided in the compensation means 11. 13 initially is zero. The composite amplifier 1 will also contribute to a signal error but this is normally compensated for by a digital predistorter provided in the system. This is not part of the invention and will not be shown here. The first and second TX boxes 7. 9 provide distortions to the signal such that an error in the output signal z can be derived in the compensation adjustment means 17 when compared to the input signal x. also called an ideal output signal. The problem to be solved by this invention is to know how much the different input signals to the composite amplifier y1 and y2 contribute to the total signal error. To be able to compensate for the signal distortions provided in the TX boxes it is necessary to know how much each transmitting branch 3, 5 contributes to the output signal.

According to the invention a composite amplifier model is provided in the compensation adjustment means 17. Said model comprises information of how the composite amplifier 1 is constructed regarding how the different input signals y1 and y2 to the composite amplifier 1 contributes to the output signal z and under which input signal conditions, I.e. one of the branches could contribute more under certain input signal conditions. The input signals x could for example differ in power levels or frequency. The compensation adjustment means 17 uses the derived error in the output signal z and the composite amplifier model to derive the contribution from each transmitting branch 3, 5 to the signal error. Hereby the compensation adjustment means 17 knows which transmitting branches 3, 5 that need to be compensated and approximately how much. The compensation can then be performed iteratively as will be discussed below.

Figure 4:
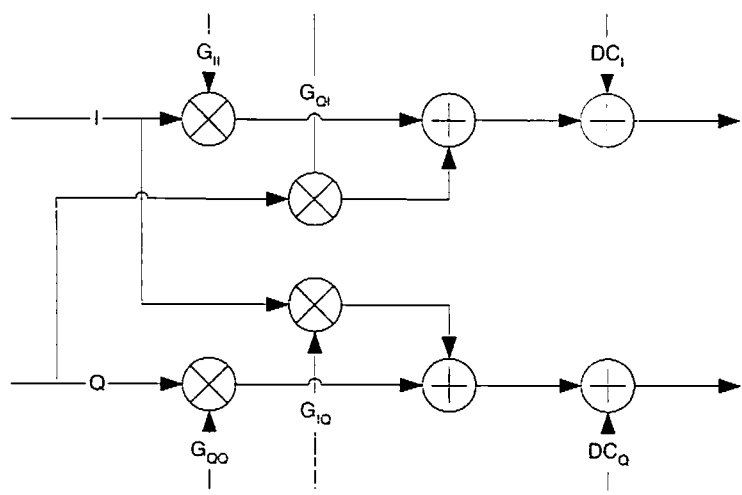
FIG. 4 shows schematically a standard implementation of IQ compensation.

The signal distortions are substantially compensated in the compensating means 11, 13 according to the already derived signal error contributions from the different branches 3, 5. To do this a transmitting branch model is used for each transmitting branch 3, 5. This transmitting branch model comprises information about the contribution to the signal distortions from different parameters, p, in the TX boxes. To compensate for these signal distortions compensating parameters, p', are introduced in the compensating means 11, 13 where each compensating parameter, p', is adapted to provide a signal distortion that substantially counteracts the signal distortion provided by the corresponding parameter p, in the TX boxes. There are a number of different ways to use these transmitting branch models to adjust the compensation in the compensating means 11, 13 such that the total signal distortion in the transmitting branches is minimised. One way to counteract the IQ-modulator errors is to digitally predistort the IQ-signal at base band using iteratively updated filter structures, for example an LMS algorithm, as described in the article "Digital Precompensation of Imperfections in Quadrature Modulators", R. Marchesani, IEEE. Trans. on Communications, vol. 48, no. 4, April 2000, pp. 552-556. A standard implementation of IQ compensation is schematically shown in FIG. 4 which will be further described below.

Figure 1B:
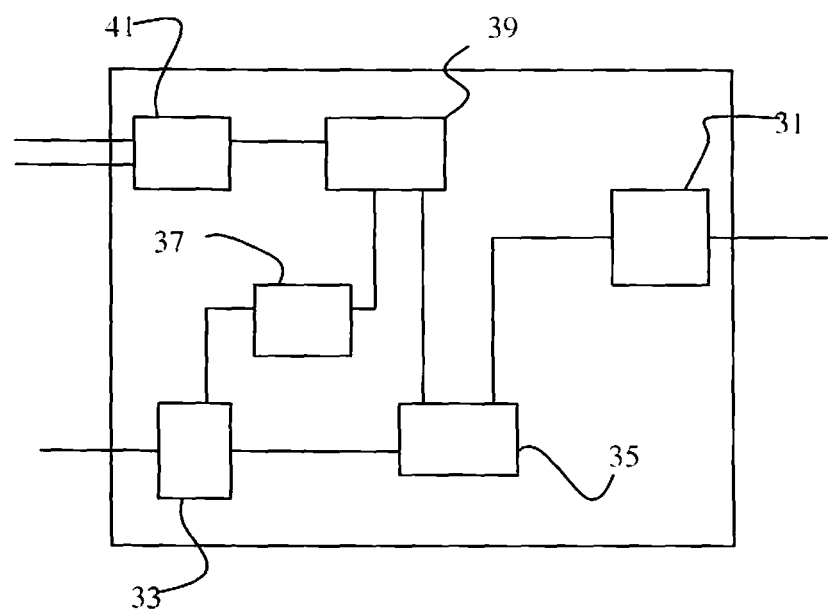
FIG. 1b shows schematically the components of the compensation adjustment means.

The functions of the compensation adjustment means 17 are now described in more detail with reference to FIG. 1b. The compensation adjustment means 17 comprises a first receiving means 31 adapted to receive the output signal z from the composite amplifier and a second receiving means 33 adapted to receive the input signal x. The first receiving means 31 and the second receiving means 33 are both connected to an error deriving means 35 adapted to compare the output signal z with the input signal x and derive an error representing the signal distortions provided in the transmitting branches 3, 5 entering the composite amplifier 1. The first and second receiving means 31 and 33 can comprise means for adjusting the signals in relation to each other, for example delay-, phase-, and gain-adjustments. Alternatively this adjusting of the signals can be performed in the error deriving means 35. The compensation adjustment means 17 comprises further a signal derivation means 37 connected to the second receiving means 33. Said signal derivation means 37 is adapted to derive the input signals a1, a2 to the respective transmitting branches 3, 5. The signal derivation means 37 uses the input signal x and information about how the signal generating means 6 works to derive the input signals a1 and a2. The compensation adjustment means 17 comprises furthermore a computation means 39 connected to the signal derivation means 37 and to the error deriving means 35. The computation means 39 comprises a composite amplifier model f and a transmitting branch model g1, g2 for each transmitting branch and uses these models together with the derived error and the derived input signals a1 and a2 to compute how much compensation parameters, p' in the compensation means 11, 13 should be changed in order to minimise the error in the output signal. This is an iterative process and the computation means 39 can in one embodiment derive the functions f, g1 and g2 in respect of the compensating parameters to see in which directions the compensating parameters, p', should be changed to minimise the error of the output signal. This will be described in more detail below. The computation means 39 is further connected to a forwarding means 41 which is adapted to forward new compensating parameters, p' to the compensation means 11, 13 in accordance with the computations made by the computation means 39.

The method is further described with reference to the flow chart of FIG. 2. In step S1 an input signal x is provided to the composite amplifier 1. In step S2 the TOR 15 observes the output signal z from the composite amplifier 1. This signal is forwarded to the compensation adjustment means 17 in S3. In S5 the observed signal is compared with an ideal output signal x in the compensation adjustment means 17 and an error of the observed signal z in relation to the ideal signal x is derived. Ideal signal means a theoretical signal travelling through the transmitting branches not being effected by any signal distortions. In this example the ideal signal is also equal to the input signal x to the generating means 6. However more signal processing such as predistortion can also be performed before the signal reaches the generating means 6.

In S9 the signal deriving means 37 utilises the known behaviour of the generating means 6 to derive the input signals a1 and a2 to the compensation means 11, 13. These signals could also, optionally, be fed directly from the transmission branches 3, 5 to the compensation adjustment means 17.

In S11 the computation means 39 derives correction steps for the compensating parameters, p', so that the error in the output signal is reduced. This computation involves utilising a composite amplifier model to derive the contribution from each transmitting branch to the derived signal error. This composite amplifier model is a model of the behaviour of the composite amplifier, for example the contribution from the different transmitting branches to the output signal for different input signal levels. If the composite amplifier for example is a Doherty amplifier the composite amplifier model tells that only one of the two amplifiers is driven during low signal levels as will be discussed further below. The computation further involves utilising a transmitting branch model for each transmitting branch of the system in order to derive the contribution of the different parameters, p, of the transmitting branch to the signal distortion giving rise to the observed error. This model comprises information about the contribution of the different parameters in the transmitting branch to the signal distortion. The main contribution to the signal distortion is the IQ-modulator but it could also be time delay or nonlinearities or frequency errors. Further details on this computation of correction steps will be described below.

Depending on the composite amplifier model it could be necessary to provide at least two different input signals such that the composite amplifier is driven differently, i.e. the constituent amplifiers and thus the transmission branches are contributing to the output signal in different amounts. The input signals could then for example differ in signal levels or frequencies.

In S13 instructions are forwarded to the compensating means 11, 13 from the compensation adjustment means 17 regarding how compensating parameters, p', in the compensating means 11, 13 should be adjusted to give a signal distortion to compensate for the signal distortions caused by the parameters, p, in the TX boxes 7, 9.

Figure 2:
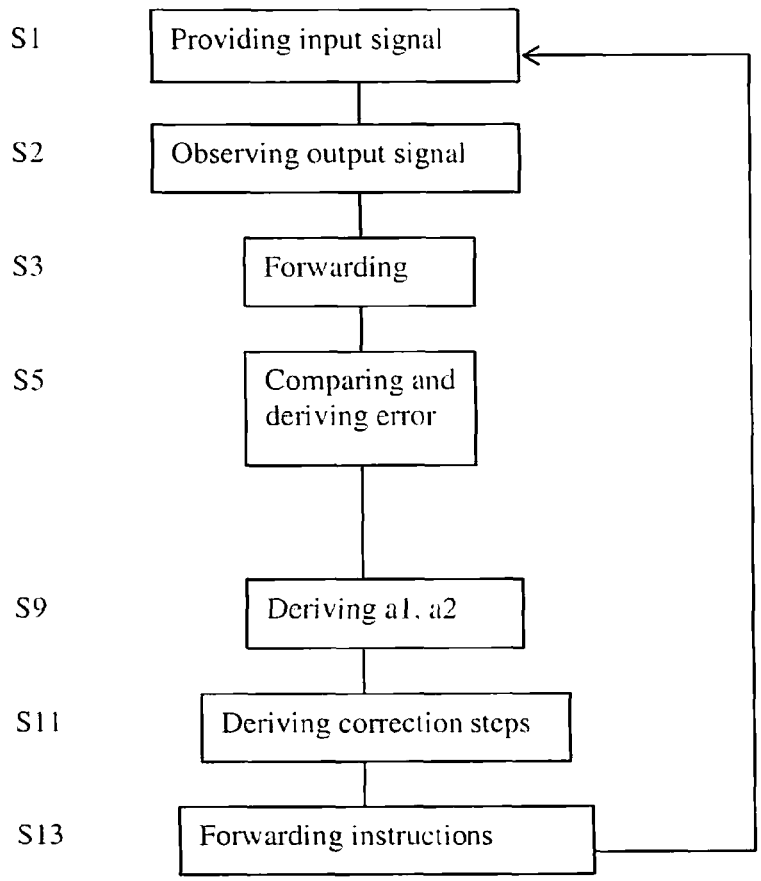
FIG. 2 is a flow chart of a method according to one embodiment of the invention.

This compensation adjustment described in relation to FIG. 2 could be performed continuously or repeatedly or at certain intervals. The adjustment of the compensating parameters is preferably an iterative process such that the compensating parameters are adjusted to more and more accurate values giving a smaller and smaller error. To achieve this iteration the input signals provided to the system have to differ in for example level or frequency as described above. Furthermore it could be advantageous to be able to change the compensation parameters, p', later during use of the system in response to for example temperature changes effecting the parameters in the TX boxes 7, 9 or changes due to aging or other variations in the components or surrounding environment. The composite amplifier model may also need to be updated over time if, for example measurements show that the model is not correct.

One possible way to provide the composite amplifier model and the transmitting branch models in the compensation adjustment means 17 is to express the output signal z as a function of the signals y1 and y2 input to the composite amplifier 1:

$$z=f(y1, y2)$$

The function f is hereby the composite amplifier model. Furthermore y1 and y2 are functions g1 and g2 of the input signals b1 and b2 to the TX boxes and of the parameters, p, in the TX boxes, here called p1 and p2 in the first TX box 7 and p3 and p4 in the second TX box 9. Of course the number of parameters could vary.

$$y1=g1(b1, p1, p2)$$

$$y2=g2(b2, p3, p4)$$

The functions g1 and g2 are hereby the transmission branch models. Furthermore b1 and b2 are functions h1 and h2 of the input signals a1 and a2 to the compensating means 11, 13 and of the compensating parameters, p', in the compensating means provided for giving an "inverted" signal distortion compared to the signal distortion provided by the parameters in the TX boxes. The compensating parameters are here called p1' and p2' for the first compensating means 11 and p3' and p4' for the second compensating means 13.

$$b1=h1(a1, p1', p2')$$

$$b2=h2(a2, p3', p4')$$

The error measured in the output signal z should be minimised by providing and stepwise changing the compensating parameters p1', p2', p3' and p4' such that the functions h1 and h2 are closer and closer to the inverses of the functions g1 and g2. Therefore the compensation adjustment means 17 comprises computation means adapted to derive first b1 in respect of p1' and p2' and b2 in respect of p3' and p4', then y1 in respect of b1 and y2 in respect of b2 and then z in respect of y1 and y2. The input signals a1 and a2 are either known, or can be derived from the input signal x and the known behaviour of the generating means 6. Using this and performing said derivatives and comparing with the observed output signal error will provide new compensating parameters p' to the compensating means 11, 13. From the above given equations and derivatives it can be found how the output signal z is effected by a change in the compensating parameters p1', p2', p3' and p4'. The equations will show in which direction the compensating parameters p', should be changed to minimise the error in the output signal z compared to the ideal output signal x. This is done iteratively, i.e. the compensating parameters, p', are changed in small steps in the direction given from the derivatives and a minimum error of the output signal z will be achieved. As said above it is necessary to provide different input signals to perform the iteration.

This is described in more detail below.

In order to compensate for the signal distortions in the TX boxes, we need to know how the compensating parameters p' affect the amplifier output. This information is contained in the partial derivatives of the output signal z with respect to the parameters p'. These derivatives can be calculated using the "chain rule" as shown for p' below:

$$\frac{\partial z}{\partial (p1')} = \frac{\partial z}{\partial (y1)} \cdot \frac{d(y1)}{d(b1)} \cdot \frac{d(b1)}{d(p1')}$$

These derivatives can be used to calculate the required step in p' using several methods. Two of these, one using Newtons method and another using an LMS-algorithm, are described below. Other options could be a Kalman filter or an RLS-algorithm.

Using Newton's method the step Δp' comes from solving the following system of equations:

$$F \cdot \Delta p' = e_{[eramklg1]}$$

F is a matrix containing the partial derivatives for several different input signals and e is a vector containing corresponding values of the error signal, Δp' is the calculated step change of the parameters p'. An example with 5 different input signal samples$_{[eramklg2]}$ is given below.

$$F = \begin{bmatrix} \frac{\partial z_1}{\partial (p1')} & \frac{\partial z_1}{\partial (p2')} & \frac{\partial z_1}{\partial (p3')} & \frac{\partial z_1}{\partial (p4')} \\ \frac{\partial z_2}{\partial (p1')} & \frac{\partial z_2}{\partial (p2')} & \frac{\partial z_2}{\partial (p3')} & \frac{\partial z_2}{\partial (p4')} \\ \frac{\partial z_3}{\partial (p1')} & \frac{\partial z_3}{\partial (p2')} & \frac{\partial z_3}{\partial (p3')} & \frac{\partial z_3}{\partial (p4')} \\ \frac{\partial z_4}{\partial (p1')} & \frac{\partial z_4}{\partial (p2')} & \frac{\partial z_4}{\partial (p3')} & \frac{\partial z_4}{\partial (p4')} \\ \frac{\partial z_5}{\partial (p1')} & \frac{\partial z_5}{\partial (p2')} & \frac{\partial z_5}{\partial (p3')} & \frac{\partial z_5}{\partial (p4')} \end{bmatrix}$$

$$\Delta p' = \begin{bmatrix} \Delta(p1') \\ \Delta(p2') \\ \Delta(p3') \\ \Delta(p4') \end{bmatrix}$$

$$e = \begin{bmatrix} x_1 - z_1 \\ x_2 - z_2 \\ x_3 - z_3 \\ x_4 - z_4 \\ x_5 - z_5 \end{bmatrix}$$

The equation system above is usually overdetermined (as above) and can then be approximately solved using a least-squares approximation. The system call also be underdetermined, in which case there exist several possible solutions.

Another option for calculating the step in p' is to use an LMS method in which steps are taken in the opposite direction of the partial derivatives:

$$\Delta(p1') = -\mu \cdot \text{Re}\left\{\frac{\partial |e|^2}{\partial (p1')}\right\} = 2 \cdot \mu \cdot \text{Re}\left\{e \cdot \left(\frac{\partial z}{\partial (p1')}\right)^*\right\}$$

where $\mu$ is a selectable parameter that controls the step-size and convergence behaviour of the algorithm. A too large value of $\mu$ results in an unstable system that won't converge, while a small value of $\mu$ results in slow convergence.

Many variations of this algorithm exists, these can include normalization and averaging over several input signals. Several steps with different input signal will be necessary for the algorithm to converge.

Figure 3:
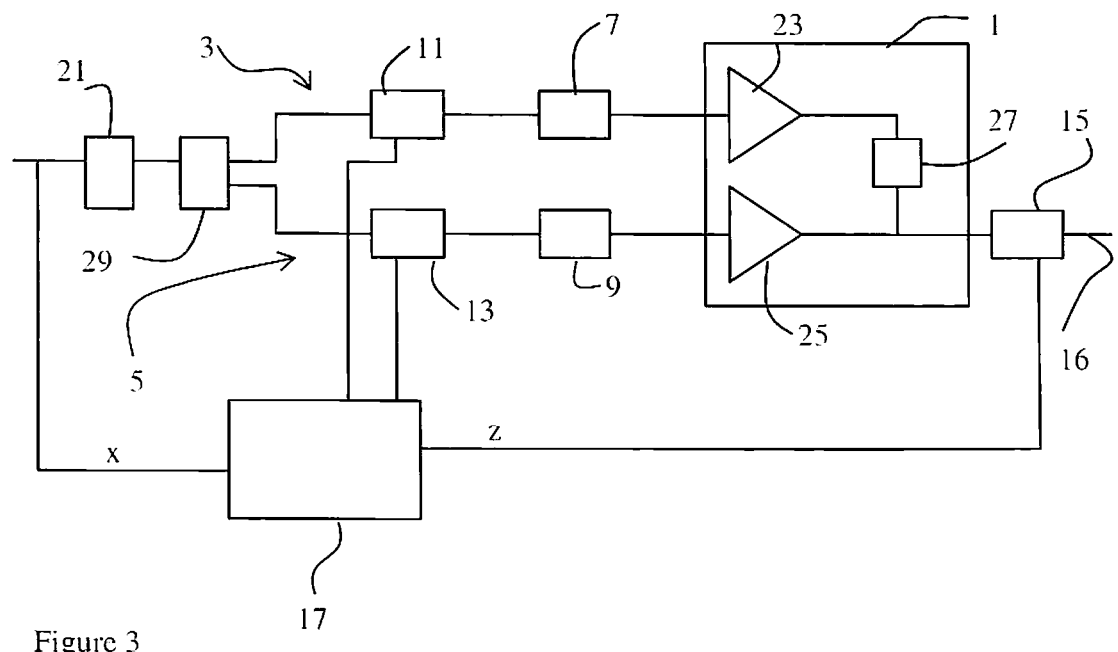
FIG. 3 shows schematically a system according to another embodiment of the invention where the composite amplifier is a Doherty amplifier.

Another embodiment of the invention where a digital Doherty amplifier is the composite amplifier will now be described. In this example only signal distortions from the IQ-modulator are considered. Other parameters could however also in this example have been regarded. The system comprising the digital Doherty amplifier is schematically shown in FIG. 3. Components being the same as in FIG. 1 are given also the same reference numbers.

In this system a digital pre-distorter 21 is shown. A digital pre-distorter is provided in order to compensate for signal distortions in the amplifiers. The Composite amplifier 1 is in this example a Doherty amplifier and comprises thus a main amplifier 23 and an auxiliary amplifier 25. The main amplifier 23 is connected to a common output of the composite amplifier via a quarter-wave transmission line 27.

Furthermore a signal component separator 29 adapted to split and shape the drive signals to the different transmission branches 3, 5 in order to achieve high efficiency from the Doherty amplifier is connected to the digital pre-distorter 21. The signal component separator 29 is in this Doherty embodiment of the invention adapted to provide a phase shift of substantially 90 degrees to the second transmission branch 5 in order to compensate for the phase shift provided by the quarter-wave transmission line 27 to the first transmission branch 3.

The composite amplifier model used by the compensation adjustment means 17 in this embodiment of the invention says thus that according to the characteristics of a Doherty amplifier only the main amplifier 23 is driven at low input signal levels. This information is used by the compensation adjustment means 17 such that the observed error in the output signal is totally assigned to the first transmitting branch 3 when low input signals are provided. Hereby the first compensating means 11 can first be adjusted according to this and according to a transmitting branch model as described above. Then according to the composite amplifier model a higher input signal level is provided and both the amplifiers are driven. The error observed now originates only from signal distortions in the second transmitting branch since the signal distortion coming from the main amplifier branch already has been compensated for. This is used together with the second transmitting branch model to adjust the parameters in the second compensating means 13.

Instead of first compensating the first transmitting branch and then provide a higher input level and compensate the second transmitting branch it is also possible to first derive the errors related from both the transmitting branches and then compensate both the branches simultaneously. This is possible since the error relating from the first transmitting branch is known from the measurements with low input signal levels and this error can be subtracted from the error observed when a higher input signal level is provided and both amplifiers are driven. The error from the first transmission branch is then assumed to rise linearly with signal level.

This embodiment is described in more detail below.

In FIG. 4 a standard implementation of IQ compensation is schematically shown. $G_{II}$, $G_{QQ}$, $G_{QI}$ and $G_{IQ}$ correspond to the compensating parameters p' in the function h described above. They compensate for the IQ error, whereby $G_{II}$ and $G_{QQ}$ compensate for gain imbalance and $G_{QI}$ and $G_{IQ}$ compensate for phase imbalance. Furthermore the terms $DC_1$ and $DC_Q$ compensate for DC-offset and CO-leakage. The corresponding equation for the first compensation means 11 (13 is similar) is:

$$b1 = G_{II} \cdot \text{Re}\{a1\} + G_{QI} \cdot \text{Im}\{a1\} + DC_1 + j \cdot G_{IQ} \cdot \text{Re}\{a1\} + j \cdot G_{QQ} \cdot \text{Im}\{a1\} + j \cdot DC_Q$$

The error from the first transmitting branch, here called the main branch (nonlinearity of the main amplifier and the IQ modulator error of the main branch and other parameters) can be estimated for the entire signal interval below a threshold where the auxiliary amplifier is turned on.

The error from the second transmitting branch, here called the auxiliary branch (nonlinearity of the auxiliary amplifier, the IQ modulator error of the auxiliary branch and other parameters) has to be estimated on the signal levels above the threshold where the auxiliary amplifier is turned on. The composite error seen at the output of the Doherty amplifier at those power levels will have contributions from both the main branch and the auxiliary branch.

The auxiliary IQ error will be seen predominantly with the approximately, 90 degrees of phase shift compared to the error from the main branch.

This solution uses direct inverse IQ compensation adaptation using only the signal Reference signal x (before the DPD block 21) and the Observation signal z (observed in the TOR 15). The adaptation is made iterative using a LMS-like algorithm.

By using the phase shift of 90 degrees and power selection on the auxiliary part, the adaptation can be made on all parameters simultaneously. The z signal is assumed to be average time and phase aligned and sometimes also gain aligned with the x signal before the IQ and DC parameter estimation.

The equations for the adaptation of the main IQ error are:

$$G_{QQ,i+1} = G_{QQ,i} + \mu_M \cdot \frac{\sum_k (\text{Im}\{x-z\} \cdot \text{Im}\{x\} - \text{Re}\{x-z\} \cdot \text{Re}\{x\}) \cdot \delta}{\sum_k |x|^2 \cdot \delta}$$

$$G_{II,i+1} = G_{II,i} - \mu_M \cdot \frac{\sum_k (\text{Im}\{x-z\} \cdot \text{Im}\{x\} - \text{Re}\{x-z\} \cdot \text{Re}\{x\}) \cdot \delta}{\sum_k |x|^2 \cdot \delta}$$

$$G_{QI,i+1} = G_{QI,i} + \mu_M \cdot \frac{\sum_k (\text{Im}\{x-z\} \cdot \text{Re}\{x\} + \text{Re}\{x-z\} \cdot \text{Im}\{x\}) \cdot \delta}{\sum_k |x|^2 \cdot \delta}$$

$$G_{IQ,i+1} = G_{IQ,i} + \mu_M \cdot \frac{\sum_k (\text{Im}\{x-z\} \cdot \text{Re}\{x\} + \text{Re}\{x-z\} \cdot \text{Im}\{x\}) \cdot \delta}{\sum_k |x|^2 \cdot \delta}$$

$$dc_{I,i+1} = dc_{I,i} + \mu_{dcM} \cdot \frac{\sum_k \text{Re}\{x-z\} \cdot \delta}{\sum_k |x|^2 \cdot \delta}$$

$$dc_{Q,i+1} = dc_{Q,i} + \mu_{dcM} \cdot \frac{\sum_k \text{Im}\{x-z\} \cdot \delta}{\sum_k |x|^2 \cdot \delta}$$

where $\delta=1$ for $|x|\leq$"the transition point for this specific Doherty amplifier" and $\delta=0$ for $|x|>$"the transition point for this specific Doherty amplifier". $\mu_M$ is the step length for the adaptation of the main IQ compensation parameters and the $\mu_{dcM}$ is the step length in the adaptation of main dc offset. These equations are a variation of the LMS equations described above, with the addition of normalization (the denominator), to make the step-size invariant of the input signal energy, and averaging (summing over several samples) to make the step less noisy.

The numerator (except the averaging) can be derived from the earlier equations by making some approximations. First, the composite amplifier model is assumed to be one for small signals, and zero for large signals, as given by the equation below (with $\gamma=1-\delta$).

$$f(y1, y2) = \delta \cdot y1 + \gamma \cdot e^{(j\pi/2)} y2$$

$$\frac{\partial z}{\partial(y1)} \approx \delta$$

Then the TX-box, 7, is assumed to only give small signal distortions which allows us to ignore them in the derivative:

$$\frac{d(y1)}{d(b1)} \approx 1$$

The pre-distorter, 21, and signal component separator, 29, is also assumed to only give a small signal distortion, so we can approximate a1 with x. Further, we assume that we don't want to correct for gain and phase errors in the IQ-compensator. This is achieved by setting $G_{II}=1+q$, $G_{QQ}=1-q$ and $G_{QI}=G_{IQ}=r$. The rest of the derivative can be extracted from the equation corresponding to FIG. 4, which gives us a complete expression for the partial derivatives of the output signal with respect to the parameters as follows:

$$\frac{\partial z}{\partial(q)} \approx x^* \cdot \delta$$

$$\frac{\partial z}{\partial(r)} \approx j \cdot x^* \cdot \delta$$

$$\frac{\partial z}{\partial(DC_I)} \approx \delta$$

$$\frac{\partial z}{\partial(DC_l)} \approx j \cdot \delta$$

This, together with the LMS equations above, and the normalization and averaging gives the update equations above.

The equations for the adaptation of the auxiliary IQ error are:

$$G_{QQ,i+1} G_{QQ,i} + \mu_A \cdot \frac{\sum_k (\text{Im}\{x-z\} \cdot \text{Im}\{xe^{(-j\pi)}\} - \text{Re}\{x-z\} \cdot \text{Re}\{xe^{(-j\pi)}\}) \cdot \gamma}{\sum_k |x|^2 \cdot \gamma}$$

$$G_{II,i+1} = G_{II,i} - \mu_A \cdot \frac{\sum_k (\text{Im}\{x-z\} \cdot \text{Im}\{xe^{(-j\pi)}\} - \text{Re}\{x-z\} \cdot \text{Re}\{xe^{(-j\pi)}\}) \cdot \gamma}{\sum_k |x|^2 \cdot \gamma}$$

$$G_{QI,i+1} = G_{QI,i} + \mu_A \cdot \frac{\sum_k (\text{Im}\{x-z\} \cdot \text{Re}\{xe^{(-j\pi)}\} + \text{Re}\{x-z\} \cdot \text{Im}\{xe^{(-j\pi)}\}) \cdot \gamma}{\sum_k |x|^2 \cdot \gamma}$$

$$G_{IQ,i+1} = G_{IQ,i} + \mu_A \cdot \frac{\sum_k (\text{Im}\{x-z\} \cdot \text{Re}\{xe^{(-j\pi)}\} + \text{Re}\{x-z\} \cdot \text{Im}\{xe^{(-j\pi)}\}) \cdot \gamma}{\sum_k |x|^2 \cdot \gamma}$$

$$dc_{I,i+1} = dc_{I,i} + \mu_{dcA} \cdot \frac{\sum_k \text{Re}\{(x-z)e^{(-j\pi/2)}\} \cdot \gamma}{\sum_k |x|^2 \cdot \gamma}$$

$$dc_{Q,j+1} = dc_{Q,i} + \mu_{dcA} \cdot \frac{\sum_k \text{Im}\{(x-z)e^{(-j\pi/2)}\} \cdot \gamma}{\sum_k |x|^2 \cdot \gamma}$$

Where:

$\gamma=1$ for $|x|>$"the transition point for this specific Doherty amplifier" and $\gamma=0$ for $|x|\leq$"the transition point for this specific Doherty amplifier" $\mu_A$ is the step length for the adaptation of the auxiliary IQ compensation parameters and the $\mu_{dcA}$ is the step length in the adaptation of auxiliary dc offset. We can derive these equations in a manner similar to the main equations by making the following approximations and observations:

$$\frac{\partial z}{\partial(y2)} \approx \gamma \cdot e^{j\pi/2}$$

$$\frac{d(y2)}{d(b2)} \approx 1$$

$$a2 \approx x \cdot e^{-j\pi/2}$$

The phase shifts above comes from the phase shift in the amplifier (we assume the phase alignment is made for the main branch) and from the phase shift in block 6. These phases are here assumed to be +/−90 degrees respectively, but they can be something else. A phase offset in the second TX box 9 relative to the first TX box 7 would for example change the shift in the first equation above. We can now use these approximations and formulate the complete derivatives for the auxiliary branch:

$$\frac{\partial z}{\partial (q)} \approx x^* \cdot e^{j\pi} \cdot \gamma$$

$$\frac{\partial z}{\partial (r)} \approx j \cdot x^* \cdot e^{j\pi} \cdot \gamma$$

$$\frac{\partial z}{\partial (DC_I)} \approx \gamma \cdot e^{j\pi/2}$$

$$\frac{\partial z}{\partial (DC_l)} \approx j \cdot \gamma \cdot e^{j\pi/2}$$

Again, we combine these with the LMS equation above and add averaging and normalization to get to the update equations above.

These equations provide a parameter compensation in both I and Q. Especially when a DPD is used this compensation is redundant. If minimum redundancy is desired only four of these parameters have to be individually adjusted, i.e. $DC_I$ and $DC_Q$, one of $G_{II}$ or $G_{QQ}$ and one of $G_{QI}$ or $G_{IQ}$.

The auxiliary amplifier is in practice visible in the output, although substantially less than the main amplifier, at all levels due to circuit parasitics. The amount of correction that can be achieved (in the first pass) thus depends on the size of the circuit parasitics relative to the nonlinear part of the main branch IQ-errors.

The auxiliary amplifier can be made more visible in the output signal in the upper region, by adjusting the amount of the main amplifier's saturation. This saturation, in the extreme, makes the main amplifier look like a short circuit. The quarter-wave line then transforms this into an open circuit at the auxiliary amplifier's output. The auxiliary amplifier's output current is then fully visible as a voltage at the output (load). Saturating the main amplifier thus magnifies the IQ-errors due to the auxiliary amplifier. This can be used to better observe them in the upper region. The change to the simple model described above is only in the visibility of the auxiliary amplifier output.

Figure 5:
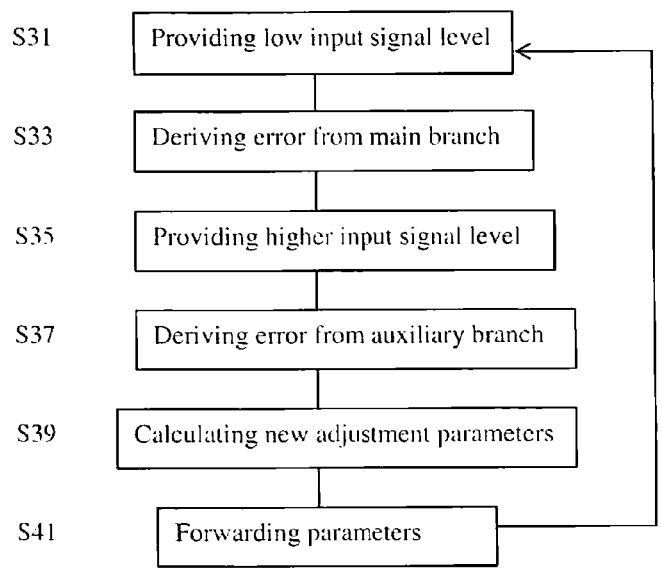
FIG. 5 is a flow chart of a method according to one embodiment of the invention.

In FIG. 5 a flow chart of the method according to the embodiment described in relation to FIG. 3 is shown. In step S31 a low input signal level below a threshold for the auxiliary amplifier is provided to the system. Hereby only the main amplifier is driven. In step S33 the compensation adjustment means 17 derives an error originating from the signal distortions in the main branch by comparing the observed signal z forwarded from the TOR 15 with an ideal signal x as described above. In step S35 an input signal level above the threshold for the auxiliary amplifier is provided. Hereby both the main amplifier and the auxiliary amplifier are driven. In S37 the error originating form the auxiliary branch is derived in the compensation adjustment means 17 by comparing the observed output signal forwarded from the TOR 15 with an ideal signal as above and subtracting the error coming from the main branch as derived in the step S33 and assuming this error is linearly rising with power.

In step S39 the compensation adjustment means 17 calculates according to the equations given above new compensating parameters and in S41 these new compensating parameters are forwarded to the first and second compensating means 11, 13. As described above this is done iteratively. Therefore the whole process is started from the beginning in step S31 and new compensating parameters are calculated for minimising the error.

If the composite amplifier comprises more than two transmitting branch inputs and possibly also more than two constitute amplifiers the composite amplifier model is of course more complicated than for a Doherty amplifier. The model could then for example include information about the contribution of the different transmitting branches to the output signal for many different input signal levels or frequencies. Hereby a combination of all this information will provide a possible way to single out the contribution from each branch.

The composite amplifier in FIG. 1 can according to the invention be a Chireix amplifier. A Chireix amplifier comprises a first amplifier connected to the first transmission branch 3 and a second amplifier connected to the second transmission branch 5. The amplifiers are connected to the output of the composite amplifier through two quarter-wave lines λ/4 and two compensating reactances +jX and −jX, which are used to extend the region of high efficiency to include lower output power levels. The efficiency of Chireix systems is analyzed in for example F. H. Raab. "Efficiency of outphasing RF Power Amplifier Systems", IEEE Trans. Communications, vol. COM-33, no. 10. pp. 1094-1099, October 1985.

Chireix amplifiers traditionally use equal-amplitude drive signals, and the IQ-modulator errors from both branches are thus equally visible in the same output level ranges. Generally this calls for a more advanced model of the amplifier, i.e. a more detailed expression of the function f above. But, either constituent amplifier can be driven by itself (with retained efficiency) at low output levels (below some transition point). The previously described method for Doherty amplifiers can then be used without alteration, except for the phase shifts. for Chireix amplifiers. The model used can then also be as simple as that of the previous Doherty example.

There is, in Chireix amplifiers, also the further possibility to first drive one amplifier at low levels and observe the IQ-errors from it, then change so that the other amplifier is the one driven at low levels and observe its IQ-errors. The Chireix amplifier, due to its balanced properties, thus has an extra possibility for individual observation of IQ-errors from the different branches. Note that this observation possibility can be achieved in the other composite amplifiers as well, but at a higher cost, since the other constituent amplifiers are not as efficient at low levels as the one that is dedicated for operation in this region.

Composite amplifiers in general can be handled by either providing an expression for derivates of the function f with respect to the input signals, or by resolving the IQ-errors from a first constituent amplifier by observing them at low levels, proceeding with a next amplifier in a higher output level region, and so on. By using the Chireix drive separation trick above, all composite amplifiers' IQ-errors can in principle be handled in succession, starting from low output levels.

Figure 6:
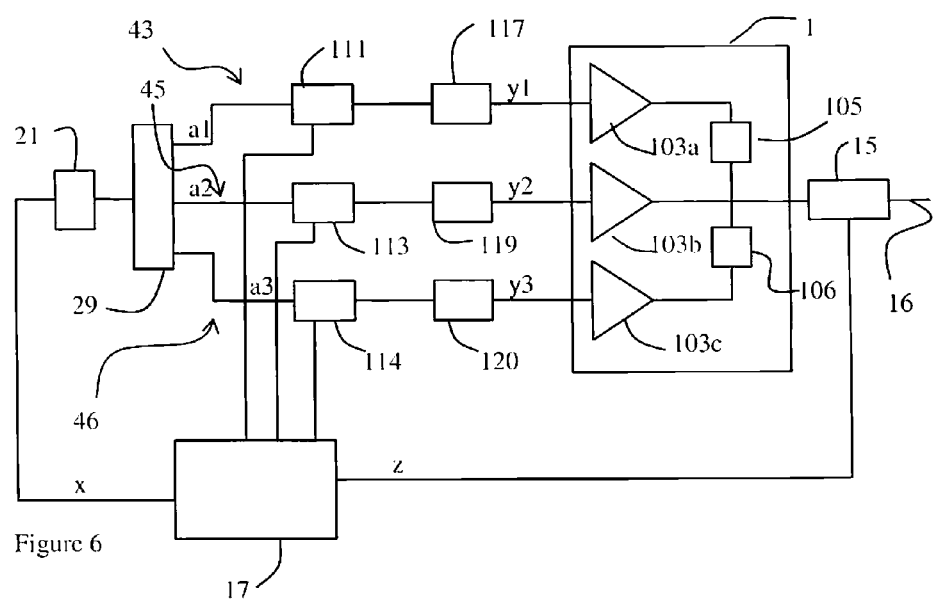
FIG. 6 shows schematically a system according to one embodiment of the invention where the composite amplifier is a Chireix-Doherty amplifier comprising three constituent amplifiers.

FIG. 6 shows an embodiment of the invention where the composite amplifier 1' is a Chireix-Doherty amplifier in accordance with WO 2004/057755. This embodiment comprises a predistorter, 21, a signal component separator, 29, that separates the input signal x into a first, a second and a third input signal a1, a2, a3 to a first, a second and a third transmission branch 43, 45 and 46 respectively. The transmission branches comprises a first, a second and a third compensation means 111, 113 and 114 respectively that according to the invention substantially compensates for signal distortion in a first, a second and a third TX box 117, 119 and 120 respectively. The composite amplifier 1' comprises a first amplifier 103a, a second amplifier 103b and a third amplifier 103c, where the first amplifier 103a is connected to the first TX box 117, the second amplifier 103b is connected to the second TX box 119 and the third amplifier 103c is connected to the third TX box 120. The composite amplifier 1' comprises further a first transmission line 105 provided between the first amplifier 103a and the output and a second transmission line 106 provided between the third amplifier 103c and the output.

One of these transmission lines is slightly shorter than a quarter wavelength and the other is slightly longer so that the first and third amplifiers 103a and 103c form a Chireix pair. The second amplifier 103b is a peak amplifier. The compensation adjustment means 17 uses the observed output signal z, from the transmitter observation receiver 15, together with the ideal output signal x to calculate the adjustment steps to the compensating parameters p', in the compensation means 111, 113 and 114 so that the observed error in the output signal is minimized.

The calculations of the adjustments to the compensating parameters p' is done utilizing a model of the amplifier $$z = f(y1, y2, y3)$$

This model is derived with respect to its input signals y1, y2 and y3. The derivate of these input signals with respect to the parameters p' are also calculated and used to adjust the compensating parameters in the way described above. It is possible to utilize signal regions where only some of the amplifiers are visible in the output to simplify the derivates. For example, the peak amplifier 103b is only visible at high output signals and the Chireix pair 103a and 103c can be driven in such a way that only one is visible at low output levels. At medium output levels both of the Chireix amplifiers are visible at the output.

The invention claimed is:

1. A method for compensating signal distortions in multiple transmitting branches entering a composite amplifier comprising the steps of:
    providing one or more input signals to the composite amplifier;
    observing an output signal from the composite amplifier for each provided input signal;
    deriving an error in the output signal by comparing the output signal with an ideal output signal, said error being caused by said signal distortions;
    deriving the individual contribution from each transmitting branch to the error by utilising a composite amplifier model, said composite amplifier model comprising information about the contribution from each constituent amplifier to the output signal for each provided input signal; and
    compensating the signal distortions in the transmitting branches accordingly, wherein
    the step of providing one or more input signals to the composite amplifier comprises providing a first input signal and a second input signal to the composite amplifier;
    the method further comprises:
       using the ideal output signal to produce a first signal and a second signal;
       producing a first compensation parameter and a second compensation parameter;
       providing the first signal to a first compensating circuit configured to distort the first signal based on the first compensation parameter, thereby producing a first distorted signal;
       providing the second signal to a second compensating circuit configured to distort the second signal based on the second compensation parameter, thereby producing a second distorted signal;
       providing the first distorted signal to a first transmission circuit comprising a first modulator, wherein the first transmission circuit is configured to use the first distorted signal and the first modulator to generate the first input signal, wherein the first input signal is a modulated signal;
       providing the second distorted signal to a second transmission circuit comprising a second modulator, wherein the second transmission circuit is configured to use the second distorted signal and the second modulator to generate the second input signal, wherein the second input signal is a modulated signal, and
    the step of producing the first and second compensation parameters comprises: (i) comparing the output signal with the ideal output signal to produce an error signal and (ii) determining the first and second compensation parameters using the error signal and the composite amplifier model.

2. The method according to claim 1, further comprising the steps of:
    deriving the contribution from different parameters in the transmitting branches to the signal distortion that causes the observed error by utilising a transmitting branch model comprising information about the parameters that affect signal distortions in each transmitting branch; and
    providing compensating parameters or adjustments to already existing compensating parameters to each transmitting branch accordingly in order to decrease the signal distortions.

3. The method according to claim 2, further comprising the steps of:
    deriving derivatives of the output signal in respect of the different compensating parameters by utilising said composite amplifier model and said transmitting branch models;
    utilising said derivatives for adapting said compensating parameters such that the error in the output signal is minimised.

4. The method according to claim 1, further comprising providing at least two different input signals levels or frequencies such that the different transmission branches contributes in different amounts to the output signal for the different input signals.

5. The method according to claim 1, further comprising the steps of:
    providing a first input signal level to the composite amplifier such that generally only one of the constituent amplifiers is driven, said amplifier hereafter being called the first amplifier;
    relating the derived error to a transmitting branch connected to the first amplifier;
    providing a second input signal level such that a second amplifier is driven either alone or together with the first amplifier;
    deriving a signal error caused by a transmitting branch connected to the second amplifier by observing the output signal and subtracting a surmised linearly rising error caused by the first transmitting branch;
    compensating the observed signal distortions by providing compensating means in each branch of the composite amplifier.

6. The method according to claim 1, wherein the composite amplifier is a Doherty amplifier.

7. The method according to claim 1, wherein the composite amplifier is a Chireix amplifier.

8. The method according to claim 1, further comprising iterating the method steps in order to obtain gradually improved compensations of the signal distortions.

9. The method of claim 1, wherein the step of determining the first and second compensation parameters comprises using the error signal, the composite amplifier model, the first signal (or a signal substantially identical thereto), and the second signal (or a signal substantially identical thereto) to determine the compensation parameters.

10. A system comprising a composite amplifier and at least two transmitting branches entering the composite amplifier, said transmitting branches comprising parameters that causes signal distortions, said system further comprising a transmitter observation receiver, TOR, connected to the output of the composite amplifier, wherein the system further comprises:
a compensation adjustment circuit connected to the TOR and adapted to derive a signal error of the output signal from the composite amplifier, said signal error being caused by signal distortions in the transmitting branches and is derived by comparing the output signal with an ideal output signal, said compensation adjustment circuit further being adapted to derive the individual contribution to the error from each transmitting branch by using a composite amplifier model comprising information about the contribution from each constituent amplifier to the output signal for each provided input signal; and
a compensating circuit in each transmitting branch, said compensating circuit being connected to the compensation adjustment circuit and adapted to receive therefrom instructions regarding how the signal distortions in each transmitting branch should be compensated, wherein
the at least two transmitting branches comprises a first transmitting branch and a second transmitting branch,
the system further comprises a first signal generator configured to generate from the ideal output signal a first input signal for inputting to the first transmitting branch and a second input signal for inputting to the second transmitting branch, and
the compensation adjustment circuit comprises a second signal generator configured to generate a first output signal and a second output signal, wherein the first output signal is substantially identical to the first input signal and the second output signal is substantially identical to the second input signal.

11. The system according to claim 10, wherein the compensation adjustment circuit further comprises a transmitting branch model for each transmitting branch comprising information about the contribution from different parameters of the transmitting branch to the signal distortion that causes the observed error, said compensation adjustment circuit being adapted to use these transmitting branch models to derive said instructions and said instructions comprising compensating parameters or adjustments to already existing compensating parameters to be forwarded to each compensating circuit in order to decrease the signal distortions.

12. The system according to claim 11, wherein the compensation adjustment circuit is adapted to derive the output signal in respect of the different compensating parameters by utilising said composite amplifier model and said transmitting branch models, said derivatives being indicative of the direction in which the compensating parameters should be changed in order to minimise the measured error.

13. The system according to claim 10, wherein the compensation adjustment circuit is adapted to first derive an error in the output signal relating only to a first transmitting branch connected to a first amplifier when an input signal level to the system is provided such that generally only the first amplifier is driven and then derive an error caused by a second transmitting branch connected to a second amplifier when a second input signal level is provided to the system such that the second amplifier is driven either alone or together with the first amplifier by observing the output signal and subtract a surmised linearly rising error caused by the first transmitting branch.

14. The system according to claim 10, wherein the composite amplifier is a Doherty amplifier.

15. The system according to claim 10, wherein the composite amplifier is a Chireix amplifier.

16. The system according to claim 10, wherein the compensation adjustment circuit is adapted to iterate the method steps in order to obtain gradually improved compensations of the signal distortions.

17. A base station in a mobile communication system comprising a system according to claim 10.

18. The system of claim 10, wherein the system is configured such that the compensation adjustment circuit receives two signals and only two signals, said two signals being the ideal output signal and the output signal from the composite amplifier.

19. The system of claim 10, wherein
the second signal generator is configured to receive the ideal output signal, and
the second signal generator is further configured to generate the first and second output signal using the ideal output signal and information about the first signal generator.

20. A compensation adjustment apparatus adapted to be connected to an output of a composite amplifier and to at least two compensation circuits provided in one each of at least two transmission branches entering the composite amplifier, the compensation adjustment apparatus comprising:
a first receiver adapted to receive an output signal from the composite amplifier;
an error deriving circuit connected to the first receiver and adapted to derive an error in the output signal caused by signal distortions in the transmitting branches by comparing the output signal with an ideal output signal;
computation circuit connected to the error deriving circuit and adapted to derive the individual contribution from each transmitting branch to the error by using a composite amplifier model comprising information about the contribution from each constituent amplifier to the output signal for each provided input signal; and
forwarding circuit connected to the computation circuit and adapted to forward instructions from the computation circuit to the compensation circuit regarding how the signal distortions in each transmitting branch should be compensated, wherein
the least two transmission branches comprises a first transmission branch configured to receive a first input signal generated by a first signal generator and a second transmission branch configured to receive a second input signal generated by the first signal generator,
the compensation adjustment apparatus further comprises a second signal generator configured to generate a first output signal and a second output single, wherein the first output signal is substantially identical to the first input signal and the second output signal is substantially identical to the second input signal.

21. The apparatus of claim 20, wherein the computation circuit further comprises a transmitting branch model for each transmitting branch comprising information about the contribution from different parameters of the transmitting branch to the signal distortion that causes the observed error, and in that the computation circuit is adapted to use these transmitting branch models to derive said instructions and said instructions comprising compensating parameters or adjustments to already existing compensating parameters to be forwarded to each compensating circuit in order to decrease the signal distortions.

22. The apparatus of claim 21, wherein the computation circuit is adapted to derive the output signal in respect of the different compensating parameters by utilising said composite amplifier model and said transmitting branch models, said derivatives being indicative of the direction in which the compensating parameters should be changed in order to minimise the measured error.

23. The apparatus of claim 20, wherein the computation circuit is adapted to first derive an error in the output signal relating only to a first transmitting branch connected to a first amplifier when an input signal level to the system is provided such that in principal only the first amplifier is driven and then derive an error caused by a second transmitting branch connected to a second amplifier when a second input signal level is provided to the system such that the second amplifier is driven either alone or together with the first amplifier by observing the output signal and subtract an assumed linearly rising error caused by the first transmitting branch.

24. The apparatus of claim 20, wherein the computation circuit is adapted to iterate the computations in order to obtain gradually improved compensations of the signal distortions.

25. The compensation adjustment apparatus of claim 20, wherein
the apparatus further comprises a second receiver for receiving the ideal output signal, and
the apparatus does not include any other receiver other than the first receiver and the second receiver.

26. The compensation adjustment apparatus of claim 20, wherein
the second signal generator is configured to receive the ideal output signal, and
the second signal generator is further configured to generate the first and second output signals using the ideal output signal and information about the first signal generator.

27. A data transmission apparatus, comprising:
a signal generator configured to generate a first signal (a1) and a second signal (a2) from an input signal (x);
a first compensating circuit configured to receive the first signal (a1) and a first compensation parameter and further configured to produce a first distorted signal by distorting the first signal (a1) based on the first compensation parameter;
a second compensating circuit configured to receive the second signal (a2) and a second compensation parameter and further configured to produce a second distorted signal by distorting the second signal (a2) based on the second compensation parameter;
a first transmission circuit comprising a first modulator configured to receive the first distorted signal and further configured to generate a first modulated signal using the first modulator;
a second transmission circuit comprising a second modulator configured to receive the second distorted signal and further configured to generate a second modulated signal using the second modulator;
a composite amplifier configured to receive the first modulated signal and the second modulated signal and further configured to use the first and second modulated signals to produce an output signal (z);
a compensation adjustment circuit configured to: (i) generate an error signal based on a comparison of the input signal (x) with the output signal (z); (ii) determine the first and second compensation parameters using the error signal and a composite amplifier model; and (3) output the determined first and second compensation parameters.

28. The data transmission apparatus of claim 27, wherein the compensation adjustment circuit comprises:
an error deriving circuit adapted to compare the output signal (z) with the input signal (x) to generate the error signal; and
a computation circuit adapted to receive the error signal and compute the first and second compensation parameters using the error signal and the composite amplifier model.

29. The data transmission apparatus of claim 28, wherein the computation circuit is further adapted to compute the first and second compensation parameters using the error signal, the composite amplifier model, a first transmitting branch model corresponding to the first transmission circuit, and a second transmitting branch model corresponding to the second transmission circuit.

30. The data transmission apparatus of claim 28, wherein the compensation adjustment circuit further comprises a signal generate adapted to receive the input signal (x) and produce therefrom a first generated signal and a second generated signal, and
the computation circuit is further adapted to receive the first and second generated signals and is further adapted to compute the first and second compensation parameters using the error signal, the composite amplifier model, and the first and second generated signals.

31. The data transmission apparatus of claim 28, wherein the computation circuit is further adapted to receive the first signal (a1) and the second signal (a2) and is further adapted to compute the first and second compensation parameters using the error signal, the composite amplifier model, and the first signal (a1), and the second signal (a2).

* * * * *

UNITED STATES PATENT AND TRADEMARK OFFICE
CERTIFICATE OF CORRECTION

PATENT NO. : 8,442,460 B2  Page 1 of 2
APPLICATION NO. : 12/296710
DATED : May 14, 2013
INVENTOR(S) : Fondén et al.

It is certified that error appears in the above-identified patent and that said Letters Patent is hereby corrected as shown below:

On the Title Page:

Item (12), under "United States Patent", in Column 1, Line 2, delete "Fonden" and insert -- Fondén --, therefor.

Item (75), under "Inventors", in Column 1, Line 1, delete "Fonden," and insert -- Fondén, --, therefor.

In the Drawings:

In Fig. 2, Sheet 1 of 4, for Tag "S9", Line 1, delete "a1 . a2" and insert -- a1 , a2 --, therefor.

In the Specification:

In Column 1, Line 34, delete "Systems"." and insert -- Systems", --, therefor.

In Column 1, Line 57, delete "Of" and insert -- of --, therefor.

In Column 2, Line 6, delete "amplifies" and insert -- amplifier --, therefor.

In Column 2, Line 28, delete "WO 20051031966)" and insert -- WO 2005/031966) --, therefor.

In Column 2, Line 32, delete "ale" and insert -- are --, therefor.

In Column 2, Line 33, delete "in" and insert -- in a --, therefor.

In Column 4, Line 31, delete "converter." and insert -- converter, --, therefor.

In Column 7, Line 30, delete "function" and insert -- function f --, therefor.

Signed and Sealed this
Twenty-fourth Day of September, 2013

Teresa Stanek Rea
*Deputy Director of the United States Patent and Trademark Office*

CERTIFICATE OF CORRECTION (continued)
U.S. Pat. No. 8,442,460 B2

In Column 8, Line 18, delete "p'" and insert -- p1' --, therefor.

In Column 9, Line 3, delete "call" and insert -- can --, therefor.

In Column 12, Line 36, in Equation, delete "$dc_{Q,j+1}$" and insert -- $dc_{Q,j+1}$ --, therefor.

In Column 13, Line 50, delete "form" and insert -- from --, therefor.

In Column 14, Line 26, delete "shifts. for" and insert -- shifts, for --, therefor.

In the Claims:

In Column 18, Line 50, in Claim 20, delete "the least" and insert -- the at least --, therefor.

In Column 18, Line 57, in Claim 20, delete "single," and insert -- signal, --, therefor.